(12) United States Patent
Takahashi et al.

(10) Patent No.: US 7,568,146 B2
(45) Date of Patent: Jul. 28, 2009

(54) SEMICONDUCTOR STORAGE DEVICE AND PSEUDO SRAM

(75) Inventors: Hiroyuki Takahashi, Kawasaki (JP); Kenji Hibino, Kawasaki (JP); Hiroyuki Matsubara, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 491 days.

(21) Appl. No.: 11/318,521

(22) Filed: Dec. 28, 2005

(65) Prior Publication Data

US 2006/0156196 A1 Jul. 13, 2006

(30) Foreign Application Priority Data

Jan. 7, 2005 (JP) ............................. 2005-003138

(51) Int. Cl.
*G11C 29/00* (2006.01)
(52) U.S. Cl. ...................................................... 714/763
(58) Field of Classification Search ................. 714/763, 714/764, 766, 767
See application file for complete search history.

(56) References Cited

U.S. PATENT DOCUMENTS

| 5,008,886 | A | | 4/1991 | Chinnaswamy et al. |
| 5,195,099 | A | * | 3/1993 | Ueda et al. .................. 714/766 |
| 5,958,079 | A | * | 9/1999 | Yoshimura .................. 714/766 |
| 6,009,547 | A | * | 12/1999 | Jaquette et al. ............. 714/758 |
| 6,526,537 | B2 | * | 2/2003 | Kishino ....................... 714/763 |
| 6,851,081 | B2 | * | 2/2005 | Yamamoto .................. 714/763 |
| 7,124,348 | B2 | * | 10/2006 | Nicolaidis ................... 714/767 |

FOREIGN PATENT DOCUMENTS

| CN | 1223444 | 7/1999 |
| JP | 11-102326 | 4/1999 |

* cited by examiner

*Primary Examiner*—Shelly A Chase
(74) *Attorney, Agent, or Firm*—Young & Thompson

(57) ABSTRACT

To provide a semiconductor storage device capable of reducing the number of ECC bits. A semiconductor storage device according to an embodiment of the invention includes a memory cell array, an ECC cell storing ECC bits, and an ECC computating circuit calculating the ECC bits, which calculates first ECC bits as the ECC bits for first data including at least one write data and a part of read data that is read from the memory cell array.

18 Claims, 11 Drawing Sheets

SEMICONDUCTOR STORAGE DEVICE AND PSEUDO SRAM

BACKGROUND OF THE INVENTION

1. Field of the Invention

The present invention relates to a semiconductor storage device and a pseudo SRAM, in particular, a semiconductor storage device and a pseudo SRAM provided with an ECC computating circuit for computing ECC (error correcting code) bits.

2. Description of Related Art

ECC memories supporting an ECC (error correcting code) function have been known in the art. The ECC memories can specify a portion (bit) where an error occurs to correct the error as well as simply detects a memory error. Information used for ECC check is hereinafter referred to as "ECC bits".

The number of ECC bits is determined based on a Hamming code. When a data bus width is N bits, the number of bits is determined by calculating the base 2 logarithm with respect to N and adding the calculation result to 2. For example, assuming that the data bus width is 64 bits, 8 bits are required as ECC bits. As a result, assuming that the data bus width is 64 bits, the ECC bits of 32 bits (=8×4) in total are necessary for 256-bit data.

Japanese Unexamined Patent Publication No. 11-102326 discloses how to reduce the number of ECC bits. According to a semiconductor storage device disclosed in Japanese Unexamined Patent Publication No. 11-102326, ECC bits are calculated using all the data subjected to burst transmission. For example, when the data bus width is 64 bits, and the burst length is 4, one ECC bit value is calculated for 256-bit data. In this case, the requisite number of ECC bits is 9 bits. That is, the number of ECC bits can be kept low.

The above related art involves the following problems. That is, only data less than 256 bits (for example, 1 byte) is written although the number of data bits necessary for calculating the ECC bits is, for example, 256 bits, the ECC bits cannot be calculated. The same problem arises in such a case that burst write is executed but the burst-transmission data is masked.

SUMMARY OF THE INVENTION

A semiconductor storage ice according to an aspect of the present invention includes: a memory cell array; an ECC cell storing ECC bits; and an ECC computating circuit calculating the ECC bits, which calculates first ECC bits as the ECC bits for first data including at least one write data and a part of read data that is to be read from the memory cell array. Consequently, the total number of ECC bits can be reduced. In particular, when the write data is less than the number of bits necessary for calculating the ECC bits, the ECC bits the total number of which is reduced can be calculated.

A semiconductor storage device according to another aspect of the present invention includes: a memory cell array; an ECC cell storing ECC bits; an error detection/correction circuit detecting and correcting an error of the memory cell array using read data from the memory cell array to output corrected data; and an ECC generating circuit generating first ECC bits using write data to the memory cell array and the read data from the memory cell array, generating second ECC bits using the corrected data outputted from the error detection/correction circuit, and storing one of the first ECC bits and the second ECC bits to the ECC cell based on a result of error detection for the memory cell array by the error detection/correction circuit. Consequently, the total number of ECC bits can be reduced. In particular, when the write data is less than the number of bits necessary for calculating the ECC bits, the ECC bits the total number of which is reduced can be calculated. Further, a time period necessary for determining the ECC bits can be reduced to improve the operational speed.

According to the semiconductor storage device of the present invention, the total number of ECC bits can be reduced. In particular, even if the number of write data bits is less than the number of data bits necessary for calculating the ECC bits, the ECC bits the total number of which is reduced can be calculated.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A semiconductor storage device according to the present invention is described below with reference to the accompanying drawings.

Figure 1:
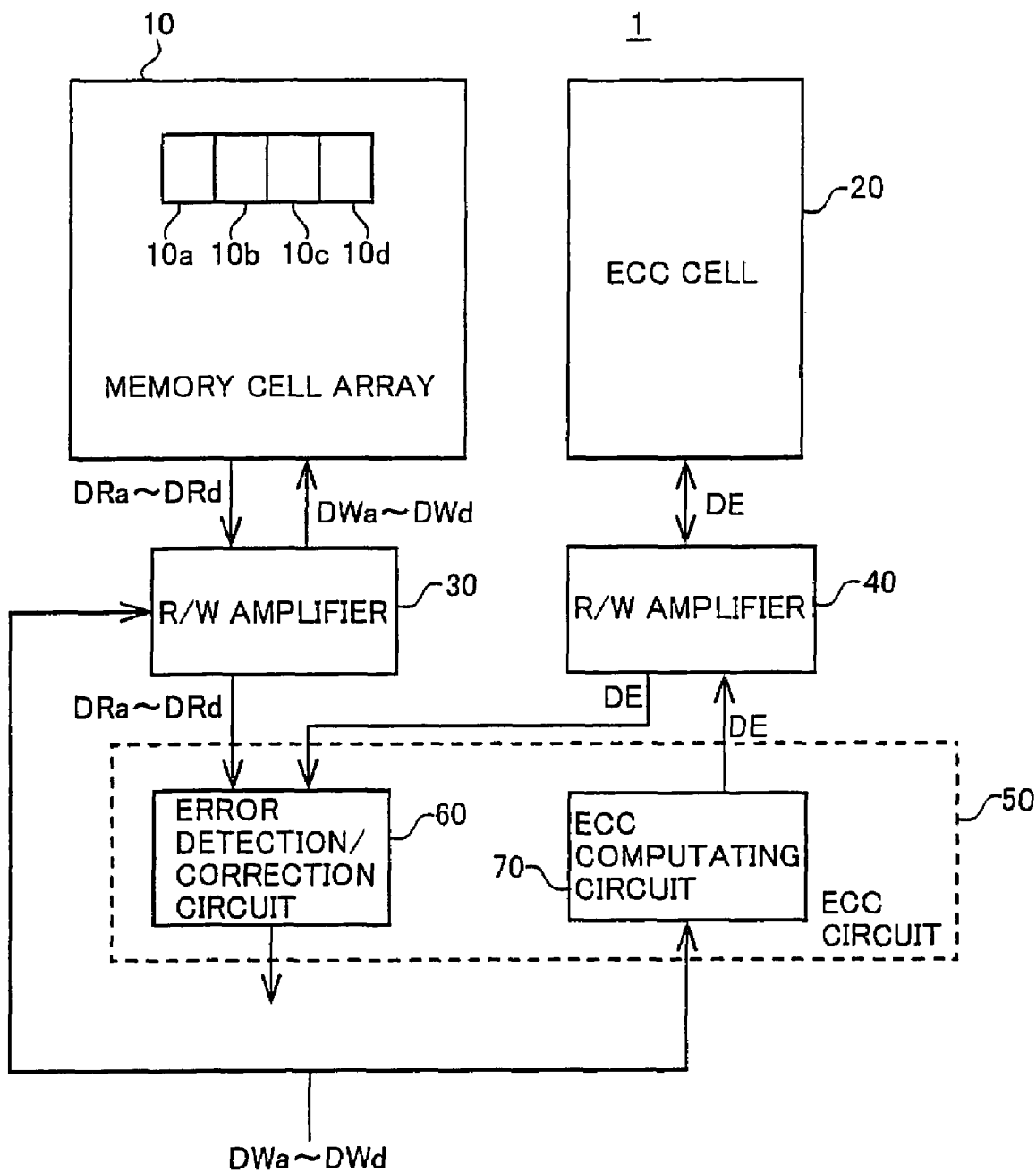
FIG. 1 is a block diagram showing the configuration and operation of a semiconductor storage device according to the present invention.

FIG. 1 is a block diagram showing the configuration and operation of the semiconductor storage device according to the present invention. A semiconductor storage device 1 includes a memory cell array 10 and an R/W amplifier 30 for writing/reading data to/from the memory cell array 10. The memory cell array 10 includes plural memory cells arrayed in position. Each memory cell of the memory cell array 10 is composed of a capacitor for storing charges corresponding to data and a transistor. That is, a memory to be refreshed such as a DRAM or pseudo SRAM is used as the semiconductor storage device 1. Further, the semiconductor storage device 1 supports "burst function".

In the semiconductor storage device 1, a time period for holding charges in a capacitor is called a "hold time". If the hold time of a given memory cell is shortened due to the deterioration, data stored in the memory cell may be lost before the refreshing operation. In order to handle such an error, the semiconductor storage device 1 according to the present invention has the ECC function. More specifically, as shown in FIG. 1, the semiconductor storage device 1 includes an ECC cell (ECC cell array) 20 for storing ECC bits, and an ECC circuit 50. The ECC circuit 50 has a function of calculating the ECC bits and+ a function of detecting/correcting a memory error. The ECC circuit 50 is connected to the memory cell array 10 via the R/W amplifier 30 and to the ECC cell 20 via the R/W amplifier 40.

The ECC circuit 50 includes an error detection/correction circuit 60 and an ECC computing circuit 70. The error detection/correction circuit 60 receives read data to be read from the memory cell array 10 and ECC bits stored in the ECC cell 20 in association with the read data. Then, the error detection/correction circuit 60 detects an error in the read data using the ECC bits. When detecting an error, the error detection/correction circuit 60 corrects the read data. The ECC computing circuit 70 calculates the ECC bits with respect to write data of a predetermined number of bits. That is, the ECC computing circuit 70 is an ECC generating circuit to generate the ECC bits. The calculated number of ECC bits is stored in the ECC cell 20 in association with the write data.

In the present invention, the ECC circuit 50 processes data on the basis of several pieces. That is, the ECC computing circuit 70 calculates the ECC bits on the basis of several pieces of data. The error detection/correction circuit 60 checks an error on the basis of several pieces of data. Assuming that the data bus width is, for example, 64 bits, the ECC computing circuit 70 calculates the ECC bits based on 256-bit data. The number of data bits necessary for calculating the ECC bits is hereinafter referred to as "requisite bit number". Upon the burst transmission, the requisite bit number is represented by "data bus width"×burst length.

Hereinafter, the operation of the semiconductor storage device 1 according to the present invention is described in more detail. In the following example, the data bus width is 64 bits, and the burst length is 4. In addition, the requisite bit number is 256.

Burst Write Operation:

As shown in FIG. 1, four 64-bit write data DWa to DWd are supplied to the R/W amplifier 30. That is, the consecutive first to fourth write data DWa to DWd are loaded to the R/W amplifier 30 through serial transmission via a data bus (not shown). Each of write data DWa to DWd corresponds to one access address. A first access address corresponding to the first write data DWa is an external address that is externally supplied. On the other hand, addresses corresponding to the second to fourth write data DWb to DWd are internal addresses generated internally. The internal addresses are generated corresponding to the external address. The first to fourth write data DWa to DWd are written to blocks (memory cell groups) 10a to 10d of the memory cell array 10, respectively.

Figure 2:
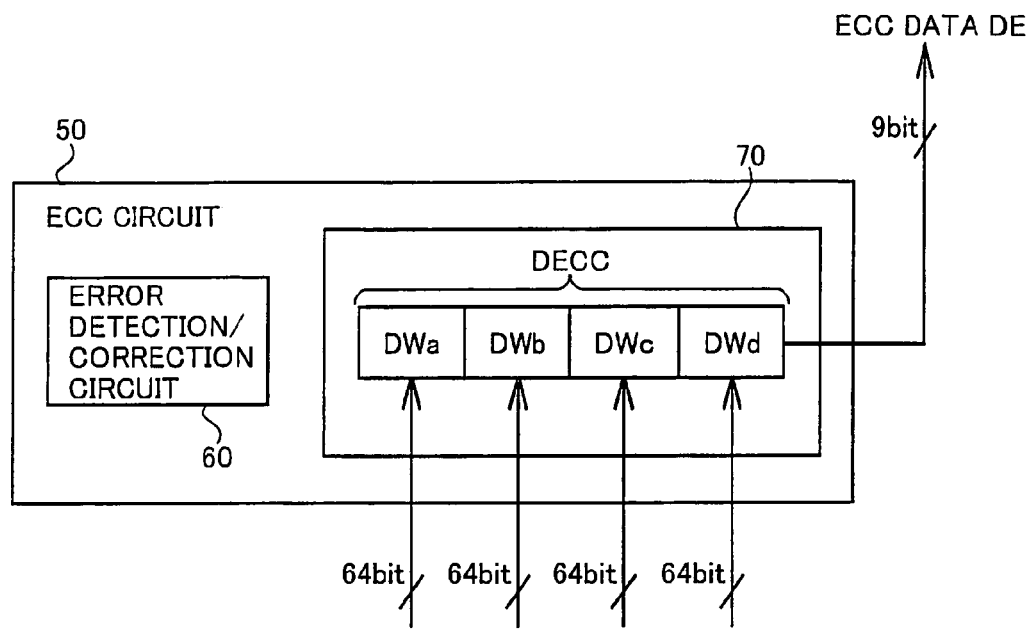
FIG. 2 illustrates processings executed in an ECC circuit during a burst write operation.

FIG. 2 illustrates processings executed in the ECC circuit 50 during the burst write operation. The first to fourth write data DWa to DWd are also loaded to the ECC computating circuit 70. The ECC computing circuit 70 integrates the first to fourth write data DWa to DWd into "ECC calculation data DECC". The bit number of the ECC calculation data DECC is the requisite bit number, that is, 256 bits. The ECC computating circuit 70 calculates the ECC bits as 9 bits using the ECC calculation data DECC. In this way, as compared with the case of calculating the ECC bits every write data, the total number of ECC bits can be reduced. The ECC computing circuit 70 outputs the ECC data DE representing the calculated ECC bits.

The 256-bit write data DWa to DWd are written to the blocks 10a to 10d, respectively. At the same time, the 9-bit ECC data DE is written to the ECC cell 20. The write data DWa to DWd are stored in association with the ECC data DE.

Burst Read Operation:

As shown in FIG. 1, first to fourth read data DRa to DRd are read from the blocks 10a to 10d of the memory cell array, respectively, and transferred to the R/W amplifier 30. A first address corresponding to the first read data DRa is an external address that is externally supplied. On the other hand, addresses corresponding to the second to fourth read data DRb to DRd are internal addresses generated internally. The internal addresses are generated corresponding to the external address. The ECC data DE corresponding to the read data DRa to DRd is read from a given cell corresponds to the external address in the ECC cell 20, and transferred to the R/W amplifier 40. The read data DRa to DRd and the ECC data DE are transferred to the error detection/correction circuit 60.

The error detection/correction circuit 60 detects an error of the 256-bit read data DRa to DRd based on the ECC bits, that is, 9 bits. When detecting an error, the error detection/correction circuit 60 corrects the error based on the ECC bits. The corrected read data DRa to DRd are transmitted to the data bus through the serial transmission.

Partial Burst Write Operation:

The semiconductor storage device 1 according to the present invention supports not only the above operation but also the data write operation for data less than the requisite bit number. Such a data write operation is performed in such a case that data corresponding to 192 bits is masked out of the 256-bit burst data, for example. Such a partial burst write operation is detailed below. The following example shows the case where the first write data DWa as one (64-bit) write data is only written to the block 10a.

First Embodiment

Figure 3:
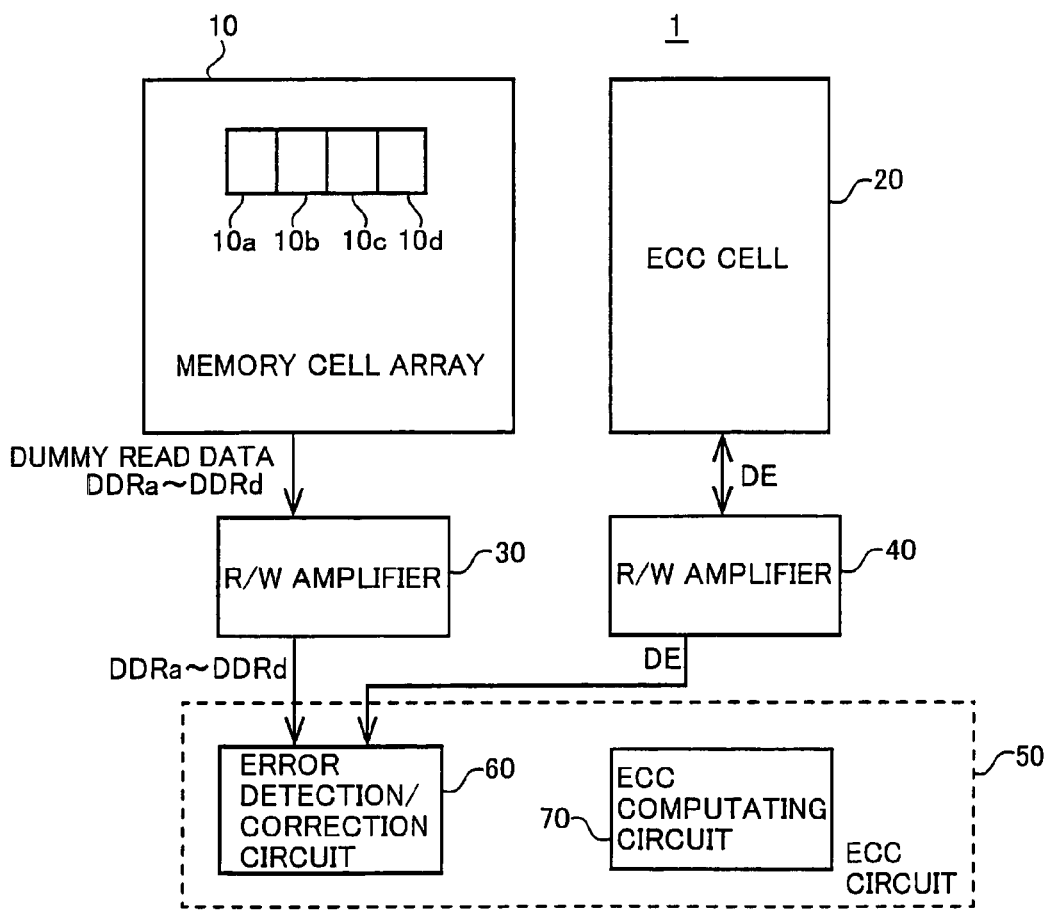
FIG. 3 is a block diagram showing the configuration and operation of a semiconductor storage device according to a first embodiment of the present invention.

In the partial burst write operation, when a write address is determined, a "dummy read operation" is first executed. FIG. 3 shows the dummy read operation according to a first embodiment of the present invention. In this embodiment, the write address is the first address to which the first write data DWa is written. When the first address is specified, data stored in the blocks 10a to 10d corresponding to the first address is read and transferred to the R/W amplifier 30. The data read from the blocks 10a to 10d are referred to as dummy read data DDRa to DDRd, respectively. The ECC data DE corresponding to the dummy read data DDRa to DDRd is read from a given cell corresponding to the first address in the ECC cell 20 and transferred to the R/W amplifier 40. The dummy read data DDRa to DDRd and the ECC data DE are transferred to the error detection/correction circuit 60.

Figure 4:
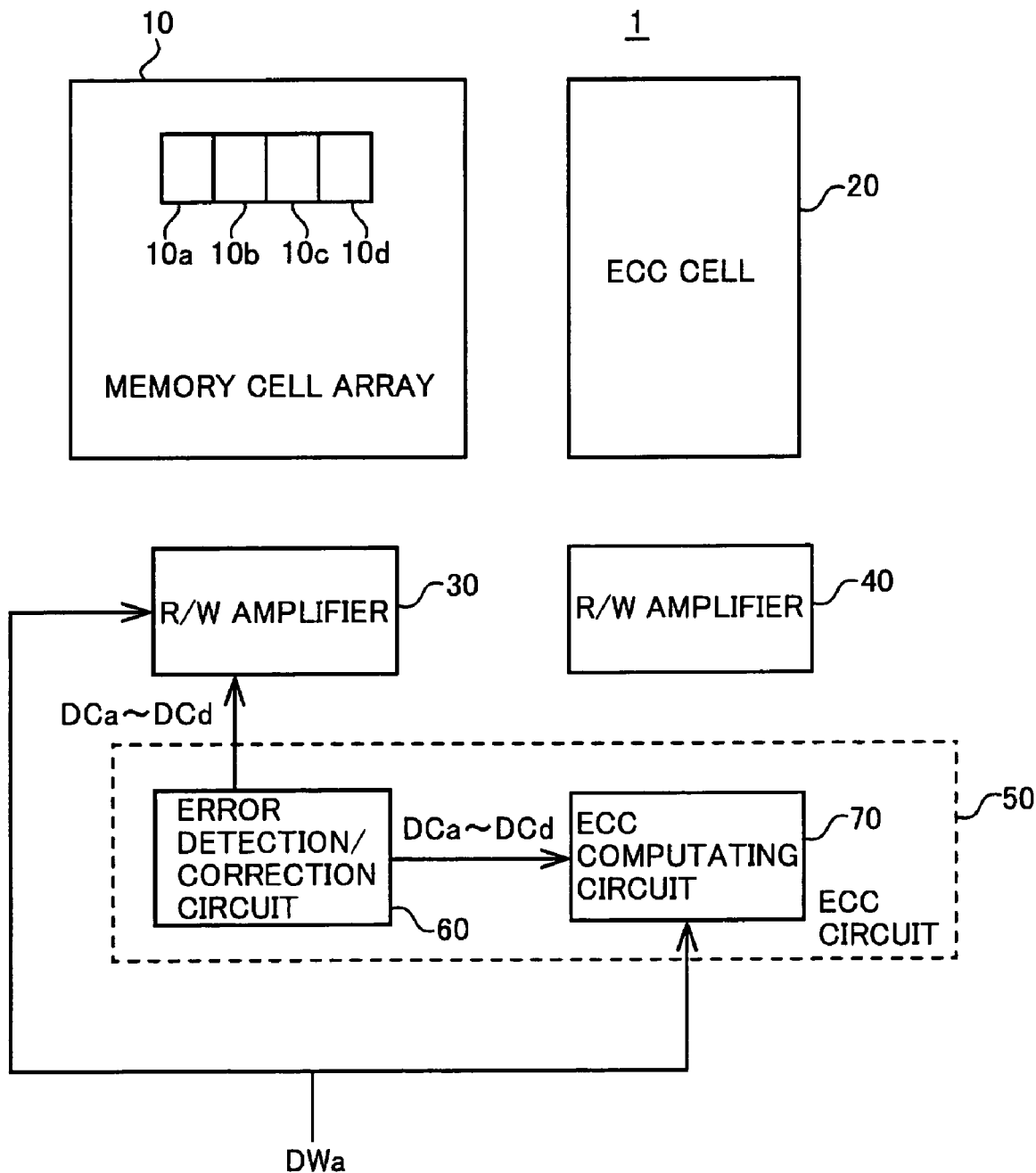
FIG. 4 is a block diagram showing the configuration and operation of the semiconductor storage device according to the first embodiment of the present invention.

FIG. 4 illustrates a following processing in the partial burst write operation according to this embodiment. The error detection/correction circuit 60 detects an error of the 256-bit dummy read data DDRa to DDRd based on the ECC bits, that is, 9 bits. When detecting an error, the error detection/correction circuit 60 corrects the error based on the ECC bits. Thus, corrected data (right data) DCa to DCd are generated using the dummy read data DDRa to DDRd. When not detecting an error, the dummy read data DDRa to DDRd are directly used as the corrected data (right data) DCa to DCd. The corrected data DCa to DCd are output to the R/W amplifier 30 and the ECC computating circuit 70. Further, the first write data DWa is sent to the R/W amplifier 30 and the ECC computating circuit 70 through the data bus. The second to fourth write data DWb to DWd are not sent.

Figure 5:
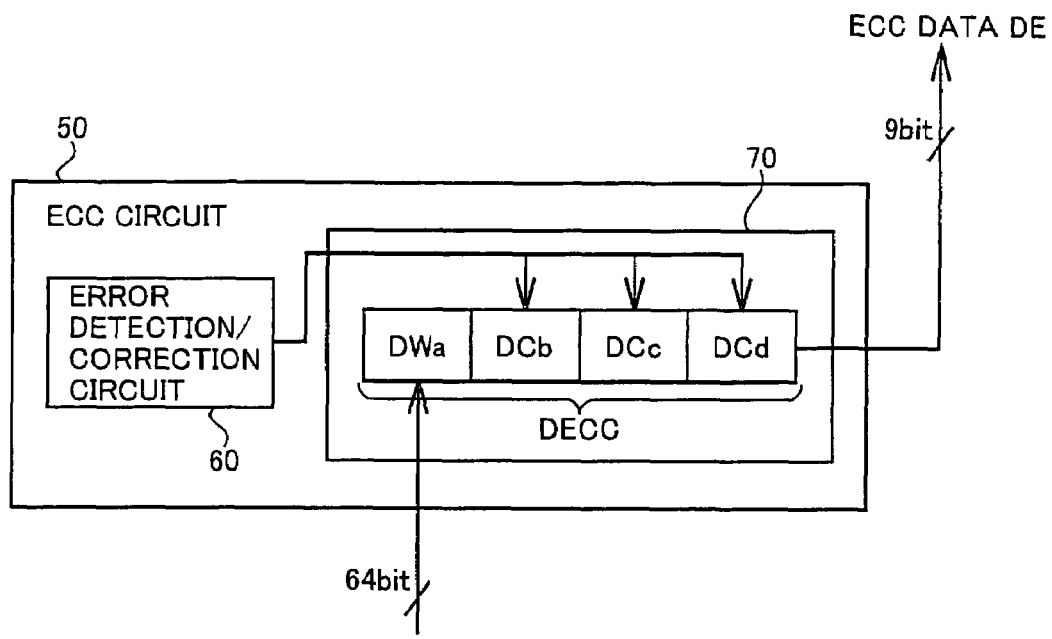
FIG. 5 illustrates processings executed in an ECC circuit according to the first embodiment of the present invention.

FIG. 5 illustrates processings executed in the ECC circuit 50 according to this embodiment. The ECC computating circuit 70 receives the corrected data DCa to DCd from the error detection/correction circuit 60 and the first write data DWa from the outside of the memory. The corrected data DCa is replaced by the first write data DWa. As shown in FIG. 5, according to this embodiment, the first write data DWa and the second to fourth corrected data DCb to DCd are used to generate the ECC calculation data DECC. The bit number of the ECC calculation data DECC is the requisite bit number, that is, 256 bits. The ECC computating circuit 70 calculates the ECC bits as 9 bits using the ECC calculation data DECC. The ECC computating circuit 70 outputs the ECC data DE representing the calculated ECC bits.

Figure 6:
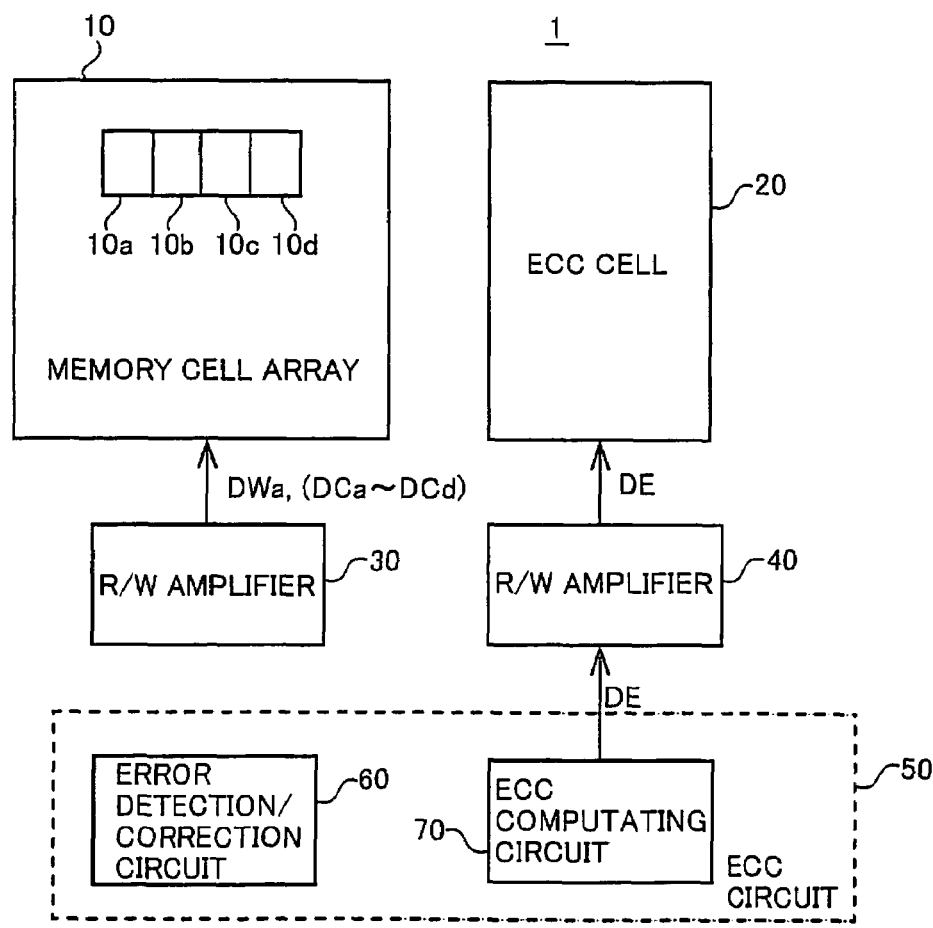
FIG. 6 is a block diagram showing the configuration and operation of the semiconductor storage device according to the first embodiment of the present invention.

FIG. 6 illustrates a following processing in the partial burst write operation according to this embodiment. The R/W amplifier 30 writes the first write data DWa to the block 10a. Further, if an error is detected in any one of the dummy read data DDRa to DDRd, the R/W amplifier 30 writes the corrected data DCb to DCd to the blocks 10b to 10d. The R/W amplifier 30 may writes the first write data DWa and the corrected data DCb to DCd to the blocks 10a to 10d irrespective of whether or not an error is detected. At the same time, the R/W amplifier 40 writes the 9-bit ECC data DE to the ECC cell 20. Here, the data written to the memory cell array 10 is associated with the data written to the ECC cell 20.

As mentioned above, according to the first embodiment, the partial burst write operation can be executed through the dummy read operation. That is, the data written to the memory cell array 10 is less than the requisite bit number, the ECC bits the total number of which is reduced can be calculated.

Second Embodiment

Figure 7:
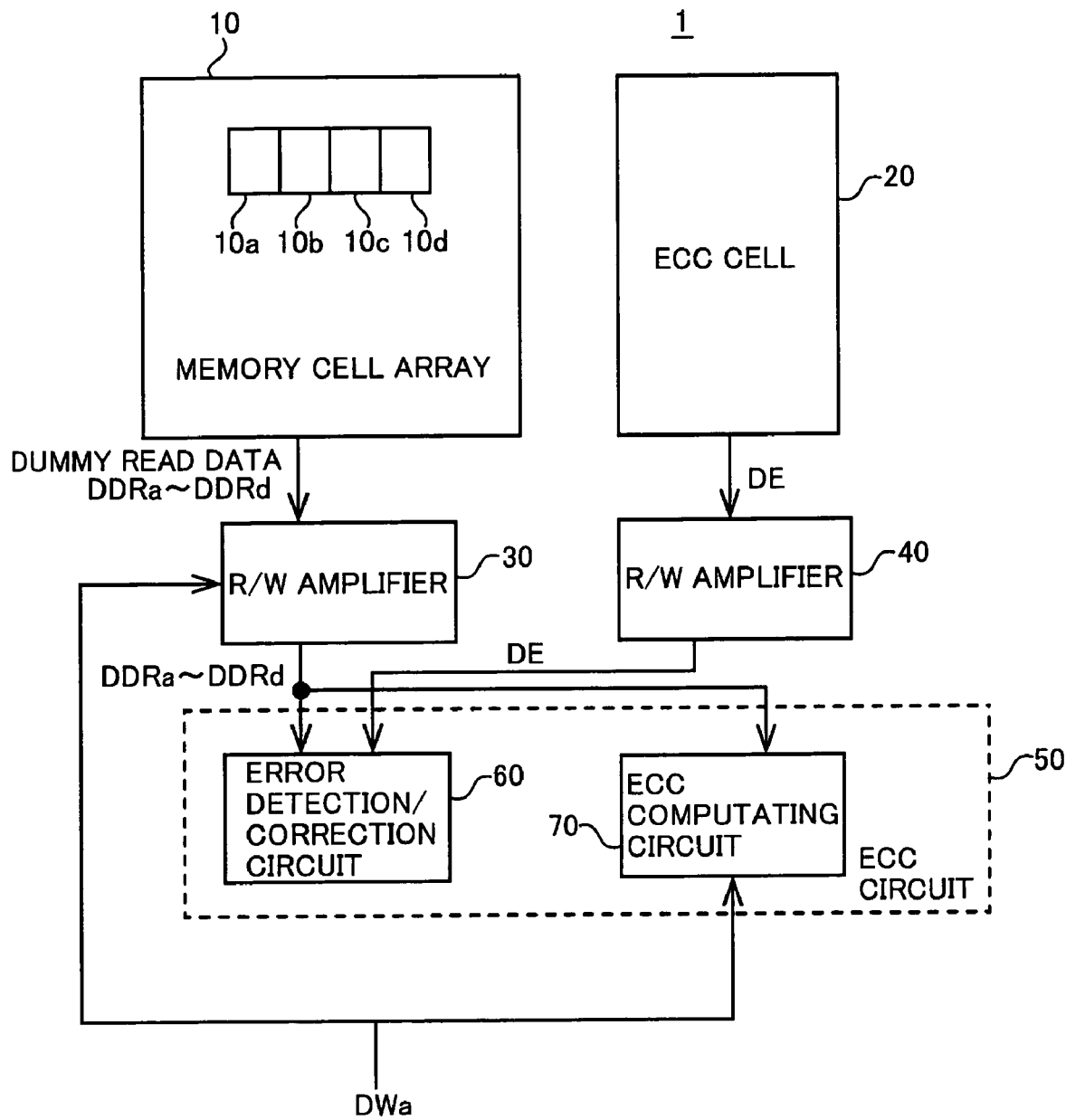
FIG. 7 is a block diagram showing the configuration and operation of a semiconductor storage device according to a second embodiment of the present invention.

In a second embodiment of the present invention as well, the "dummy read operation" is executed once the write address is determined. FIG. 7 shows the dummy read operation according to the second embodiment. In this embodiment, the write address is a first address to which the first write data DWa is written. When the first address is specified, the dummy read data DDRa to DDRd are read from the blocks 10a to 10d corresponding to the first address and transferred to the R/W amplifier 30. Further, the ECC data DE corresponding to the dummy read data DDRa to DDRd is read from a given cell corresponding to the first address in the ECC cell 20. The ECC data DE is transferred to the error detection/correction circuit 60 via the R/W amplifier 40. As shown in FIG. 7, according to this embodiment, during the dummy read operation, the dummy read data DDRa to DDRd are transferred to not only the error detection/correction circuit 60 but also the ECC computating circuit 70.

Further, the first write data DWa is input to the R/W amplifier 30 and the ECC computating circuit 70 via the data bus. The second to fourth write data DWb to DWd are not input.

Figure 8:
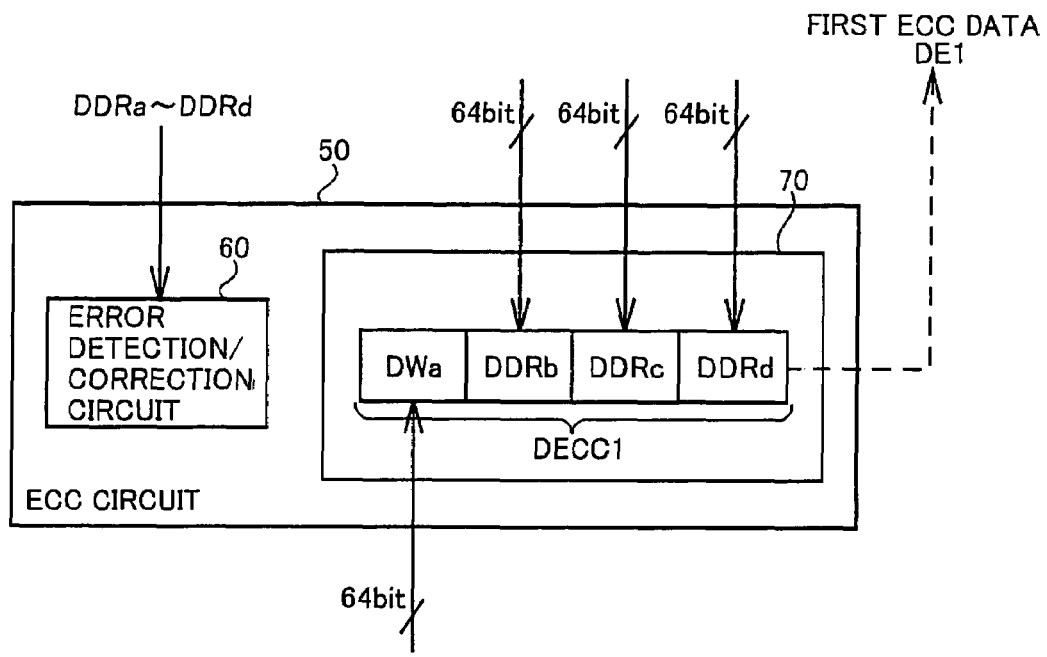
FIG. 8 illustrates processings executed in an ECC circuit according to the second embodiment of the present invention.

FIG. 8 illustrates processings executed in the ECC circuit 50 according to this embodiment. The error detection/correction circuit 60 starts an error detection processing for the dummy read data DDRa to DDRd using the ECC bits. The ECC computating circuit 70 starts a calculation processing for the ECC bit in parallel with the error detection processing. To be specific, the ECC computating circuit 70 receives the first write data DWa from the outside of the memory and receives the dummy read data DDRa to DDRd from the memory cell array 10. The dummy read data DDRa is replaced by the first write data DWa. As shown in FIG. 8, according to this embodiment, the first write data DWa and the second to fourth dummy read data DDRb to DDRd are used to generate first ECC calculation data DECC 1. The bit number of the first ECC calculation data DECC 1 is the requisite bit number, that is 256 bits. The ECC computating circuit 70 can calculate first ECC bits (first ECC code) as 9 bits using the first ECC calculation data DECC.

As mentioned above, according to the present invention, the error detection processing and the ECC calculation (first ECC calculation) are executed in parallel. Subsequent operations are difference based on whether or not the error detection/correction circuit 60 detects an error.

Figure 9:
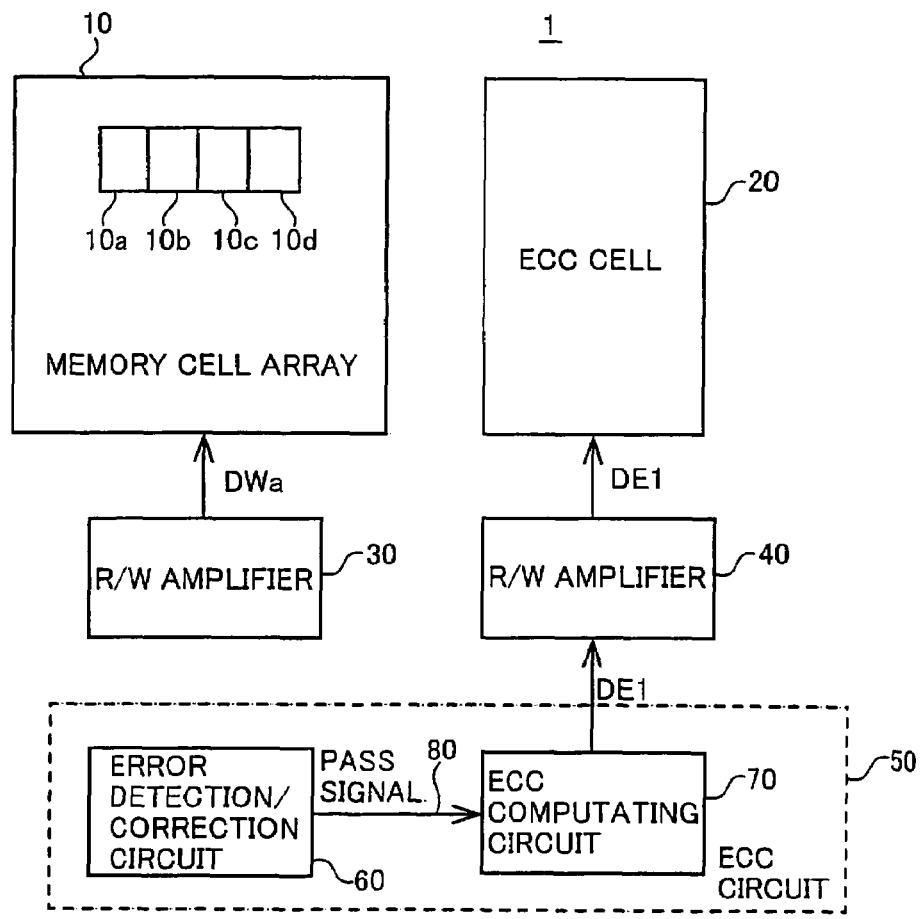
FIG. 9 is a block diagram showing the configuration and operation of the semiconductor storage device according to the second embodiment of the present invention.

FIG. 9 illustrates the next processing when no error is detected. If no error is detected, the error detection/correction circuit 60 simply outputs a pass signal 80 to the ECC computating circuit 70. The pass signal is a control signal indicating that no error is detected. In response to the pass signal 80, the ECC computating circuit 70 sends the first ECC data DE 1 indicating the calculated first ECC bits to the R/W amplifier 40. Then, the R/W amplifier 30 writes the first write data DWa to the first block 10a. At the same time, the R/W amplifier 40 writes the 9-bit first ECC data DE 1 to the ECC cell 20. Here, the data written to the memory cell array 10 is associated with the first ECC data DE 1 written to the ECC cell 20.

Figure 10:
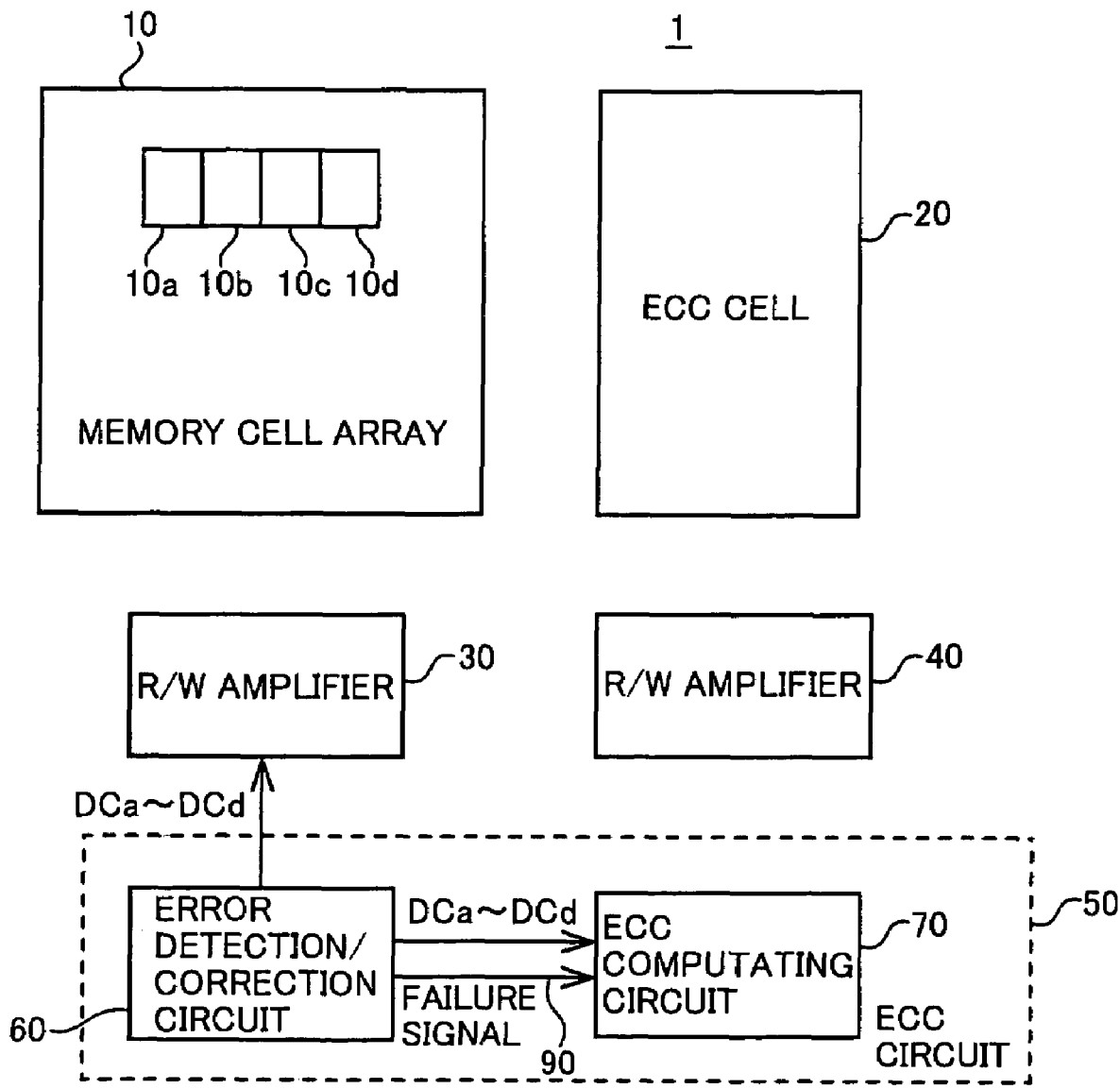
FIG. 10 is a block diagram showing the configuration and operation of the semiconductor storage device according to the second embodiment of the present invention.

FIG. 10 illustrates the next processing when an error is detected. When an error is detected, the error detection/correction circuit 60 corrects the error based on the ECC bits. Thus, the dummy read data DDRa to DDRd are used to generate the corrected data (right data) DCa to DCd. The error detection/correction circuit 60 outputs the corrected data DCa to DCd to the R/W amplifier 30. Further, the error detection/correction circuit 60 outputs the corrected data DCa to DCd together with a failure signal 90 to the ECC computating circuit 70. The failure signal 90 is a control signal indicating that an error is detected.

Receiving the failure signal 90, the ECC computating circuit 70 executes a second ECC calculation processing. The second ECC calculation processing is the same as that of FIG. 5. That is, the first write data DWa and the second to fourth corrected data DCb to DCd are used to generate second ECC calculation data DECC 2. The bit number of the second ECC calculation data DECC 2 is the requisite bit number, that is, 256 bits. The ECC computing circuit 70 can calculate second ECC bits (second ECC code) as 9 bits using the second ECC calculation data DECC 2. The ECC computing circuit 70 outputs second ECC data DE 2 indicating the calculated second ECC bits. After that, similar to the processing of FIG. 6, the write data (DWa, and DCb to DCd) are written to the memory cell array 10, and the second ECC data DE 2 is written to the ECC cell 20. The data written to the memory cell array 10 is associated with the second ECC data DE 2 written to the ECC cell 20. The ECC computating circuit 70 stores one of the first ECC bits and the second ECC bits to the ECC cell 20 based on a result of error detection for the memory cell array 10 by the error detection/correction circuit 60.

Figure 11:
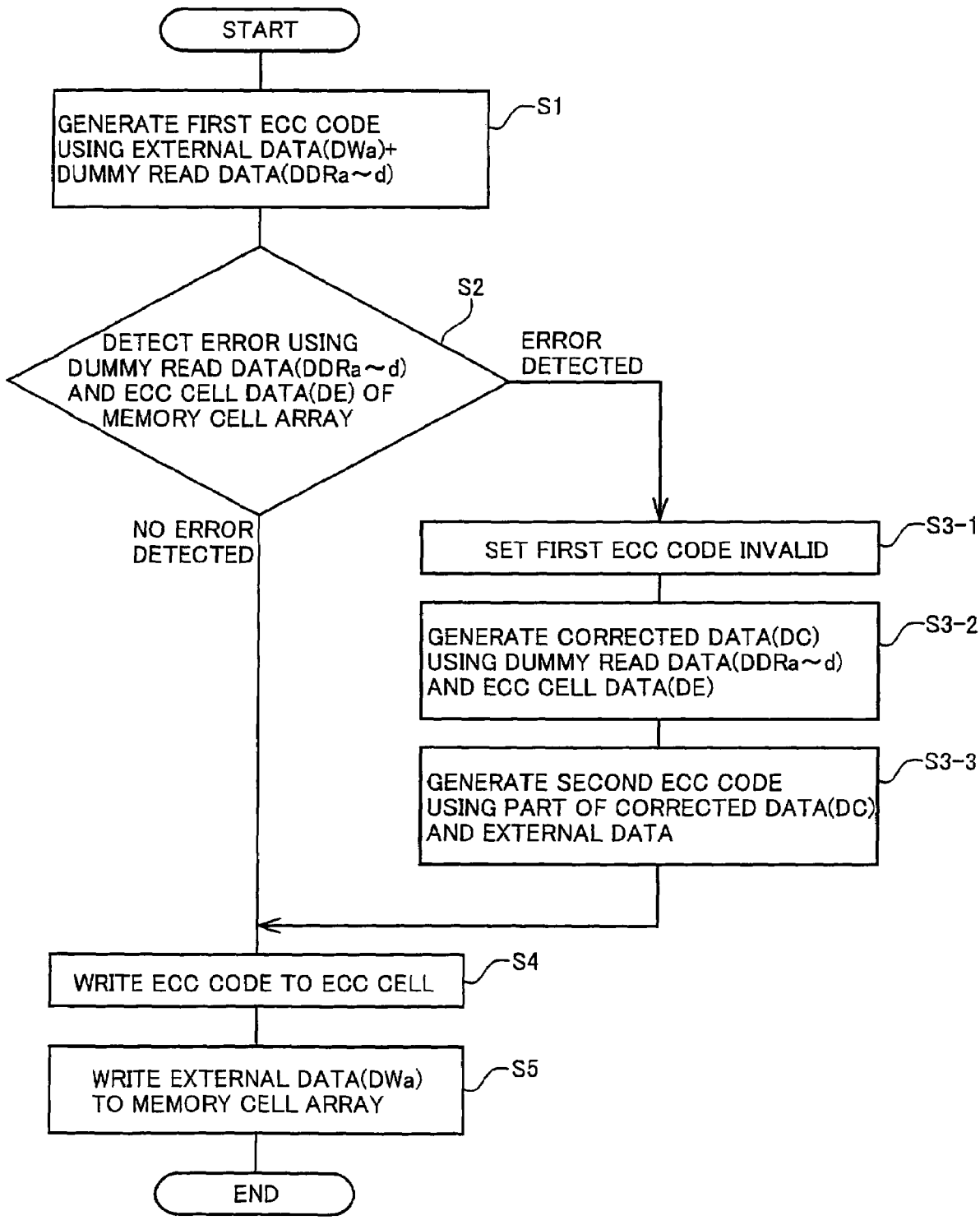
FIG. 11 is a flowchart illustrative of an outline of an operation of the semiconductor storage device according to the second embodiment of the present invention.
Figure 12:
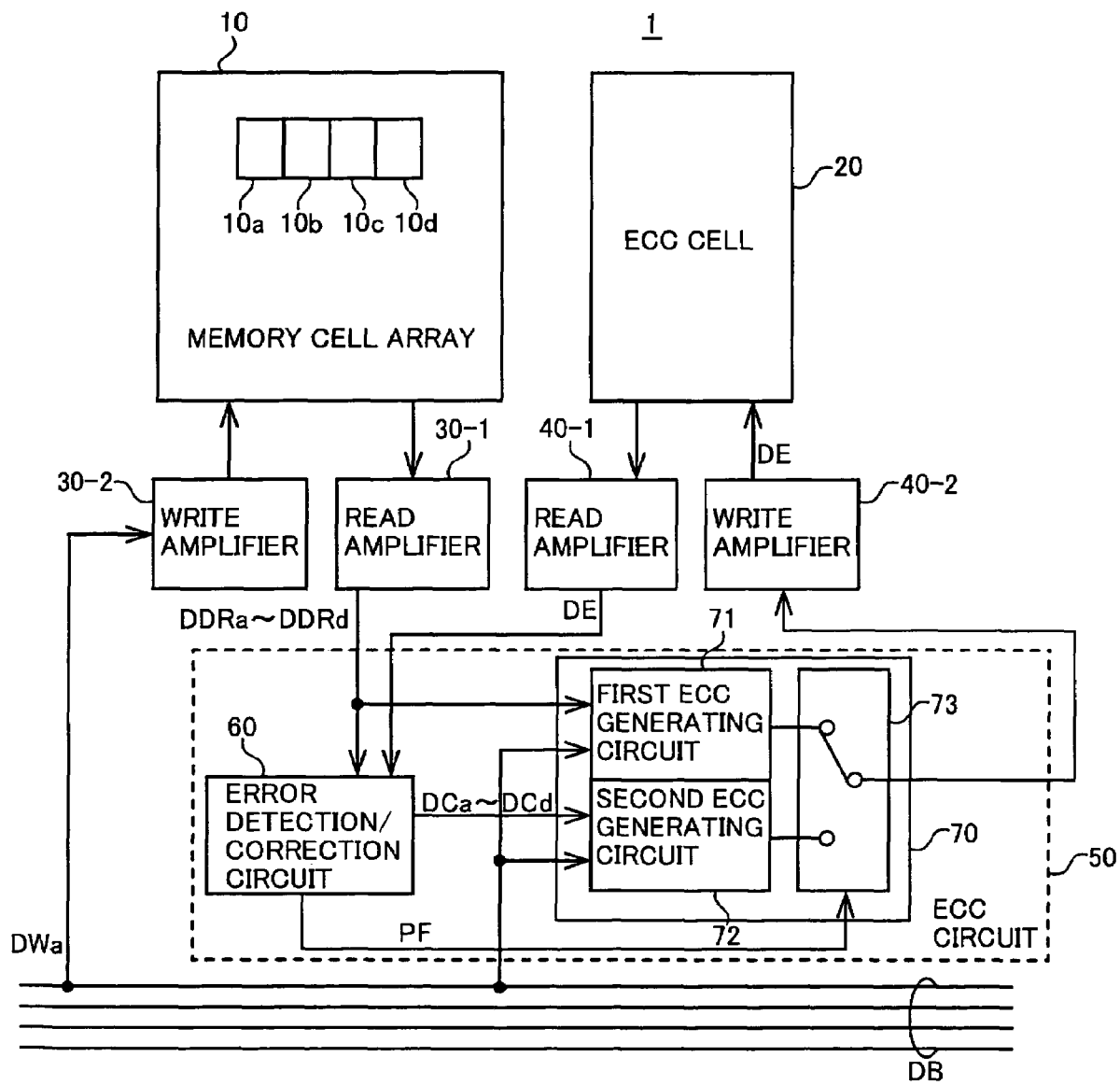
FIG. 12 is a block diagram illustrative of an outline of an operation of the semiconductor storage device according to the second embodiment of the present invention.

A flow of the operations of this embodiment is described below. FIGS. 11 and 12 are a flowchart and a block diagram showing an outline of the operations according to this embodiment. Referring to the flowchart of FIG. 11 and the overall view of FIG. 12, the operations of this embodiment are described in time series.

Step S1:

The external data DWa to be written to a cell corresponding to the first address is input to a write amplifier 30-2 and the ECC computing circuit 70 through a part of a data bus DB. Then, a read amplifier 30-1 dummy-reads cell data corresponding to the first address from the memory cell array 10 to output the obtained dummy read data DDRa to DDRd to the error detection/correction circuit 60 and ECC computating circuit 70. Likewise, the data in the ECC cell 20 corresponding to the first address is also read as the ECC data DE by an ECC cell read amplifier 40-1 and sent to the error detection/correction circuit 60. It is impossible to assure that the dummy read data DDRa to DDRd are correct at this point. However, a first ECC generating circuit 71 of the ECC computating circuit 70 prepares the "first ECC code (first ECC bits)" using uncorrected cell data (DDRa to DDRd) and the externally supplied data DWa.

Step S2:

The error detection/correction circuit 60 executes error detection for the dummy read data DDRa to DDRd. That is, it is determined whether or not the dummy read data DDRa to DDRd are correct based on the input data DDRa to DDRd and ECC data DE. A determined signal PF (pass signal 80 and failure signal 90) indicating the determination result is sent to a switching circuit 73 of the ECC computing circuit 70.

If the determined signal PF indicates that the dummy read data is correct, the switching circuit 73 sets the above "first ECC code" valid. Then, step S4 is executed.

The process of Step S1 and the process of Step S2 may be processed in parallel. In this case, the first period processing step S1 and the second period processing step S2 are partially overlapped. Therefore, in the case where no error is detected in dummy read operation, that is, in most cases, a time period necessary for determining the ECC bits can be reduced.

Step S3:

On the other hand, if the determined signal PF indicates that the dummy read data is incorrect, the switching circuit 73 sets the above "first ECC code" invalid (step S3-1). The error detection/correction circuit 60 corrects an error of the dummy read data DDRa to DDRd to send the corrected data DCa to DCd to the ECC computating circuit 70 (step S3-2). A second ECC generating circuit 72 of the ECC computating circuit 70 generates a "second ECC code (second ECC bits)" based on the corrected data DCa to DCd and the externally supplied data DWa. Thereafter, step S4 is executed.

In the case where error is detected, the corrected data DCa to DCd may be written to the area (block 10a-10d) where the error is detected in the memory cell array.

The generated first ECC code or second ECC code is written to the ECC cell 20 via an ECC write amplifier 40-2 (step S4). Thereafter, the write amplifier 30-2 writes the external data DWa to the memory cell array 10 (step S5).

In this way, as apparent from the flowchart of FIG. 11 illustrating the processing of FIG. 12, when an error is detected in the dummy read data, processes of steps S3-1 to S3-3 are additionally required as compared with the case of detecting no error. A processing time is accordingly increased. Conversely, if no error is detected, such an additional flow is unnecessary to save the processing time.

In the illustrated example of FIG. 12, the first ECC code generating circuit 71 is separate from the second ECC code generating circuit 72, but the first ECC code and the second ECC code may be generated in time series in a single circuit.

The semiconductor storage device 1 according to this embodiment produces the following beneficial effects. That is, as in the first embodiment, the partial burst write operation is realized through the dummy read operation. That is, even if the data written to the memory cell array 10 is less than the requisite bit number, the ECC bits the total bit number of which is reduced can be calculated.

Further, this embodiment achieves an additional beneficial effect that the processing speed increases. This is because the error detection/correction circuit 60 or the ECC computing circuit 70 is composed of multistage logical circuits, and it takes much time to execute the "error detection processing" or "ECC calculation processing". Here, according to the first embodiment, the corrected data DC is generated through the error detection processing, after that the ECC calculation processing is executed based on the corrected data DC. However, in the actual operation, there is an extremely low probability that an error occurs, so the corrected data DC may not be used. Thus, according to this embodiment, the dummy read data DDR is directly input to the ECC computing circuit 70 not through the error detection/correction circuit 60. Then, the first ECC calculation processing is executed based on the dummy read data DDR in parallel with the error detection processing. In the case where no error is detected, that is, in most cases, the first ECC data DE 1 obtained in the first ECC calculation processing may be adopted. Only when an error is detected, the second ECC calculation processing is executed. As mentioned above, according to this embodiment, a time period necessary for determining the ECC bits can be reduced (see FIG. 11). As compared with the first embodiment, the second embodiment has an effect of increasing the total processing speed and operational speed.

If an error is detected, and in addition, the error corresponds to a block to which the first write data DWa is written, the error detection/correction circuit 60 may output the pass signal 80 in place of the failure signal 90. In this case, the processing of FIG. 9 is executed instead of the processing of FIG. 10 to write the first ECC data DE 1 to the ECC cell 20. The data DWa is newly written to the area (block 10a) where the error is detected, so the error is corrected. In this case, the effect of increasing the processing speed and operation speed can be obtained as well.

Figure 13:
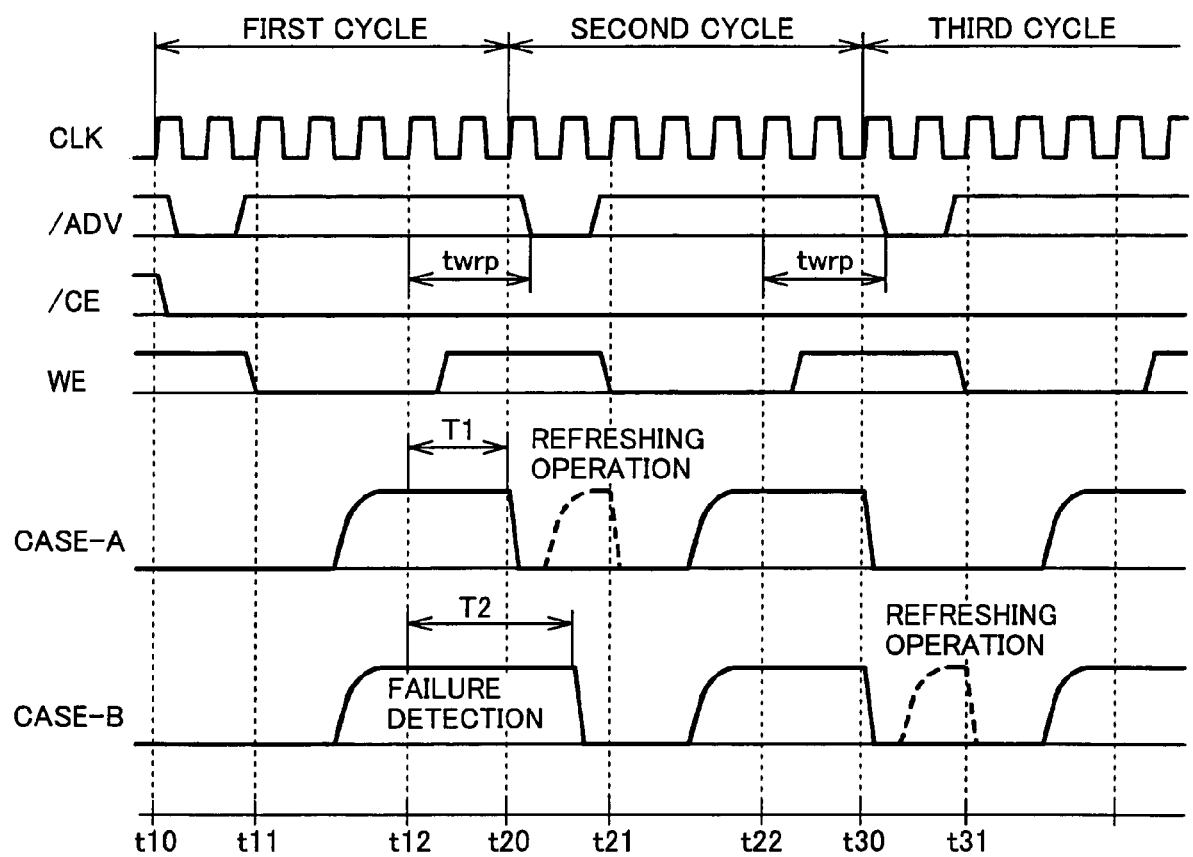
FIG. 13 is a timing chart showing an operational example of the semiconductor storage device according to the second embodiment of the present invention.

FIG. 13 is a timing chart showing an operational example of the semiconductor storage device 1 according to the second embodiment of the present invention. FIG. 13 illustrates a clock signal CLK, a control signal /ADV (address data valid), a chip select signal /CE, a write enable signal /WE, and word line signals (CASE-A and CASE-B). The CASE-A corresponds to a case where the error detection/correction circuit 60 detects no error, and CASE-B corresponds to a case where the error detection/correction circuit 60 detects an error.

In the illustrated example, the read/write operation for the memory cell array 10 is executed on a cycle basis. As shown in FIG. 13, a first cycle corresponds to a period from the time t10 to t20. A second cycle corresponds to a period from the time t20 to t30. A third cycle corresponds to a period from the time t30. In each cycle, the refreshing operation period and the read/write operation period are separately defined. For example, in the first cycle, the refreshing operation period is from the time t10 to t11, during which the refreshing operation is allowed. The read/write operation period is from the time t11 to t20.

When no error is detected (CASE-A), the following operation is performed. That is, the write enable signal /WE is set LOW at the time t11 to start the supply of write data. After that, the above partial burst write operation is carried out. In the CASE-A, the partial burst write operation (dummy read processing, the first ECC calculation processing, and write processing) is continued from the time t12 to t20. This write period T1 is set shorter than a period twrp from the time t12 until a refreshing operation of the next cycle (second cycle). This prevents an overlap between the partial burst write operation and the refreshing operation in the case where no error is detected.

During the second cycle from the time t20 to t21, the control signal /ADV is set LOW. In this period, the refreshing operation is executed in response to an instruction from an internal refresh timer. After that, a subsequent write operation is executed during a period from the time t21 to t30.

If an error is detected (CASE-B), the following operation is carried out. The write enable signal /WE is set LOW at the time t11 to start the supply of the write data. After that, the above partial burst write operation is executed. In the CASE-B, the partial burst write operation (dummy read processing, the first ECC calculation processing, the second ECC calculation processing, and write processing) is continued from the time t12 to the end of a write period T2. In this case, the second ECC calculation processing as well as the first ECC calculation processing is executed, the write period T2 is longer than the write period T1 or the period twrp. That is, the write operation of the first cycle is shifted in time to overlap into the second cycle. Thus, in the second cycle, the refreshing operation is "inhibited" under control. The refreshing operation is executed in a third cycle (time t30 to t31) following the second cycle instead.

As mentioned above, according to this embodiment, when an error is detected in a given cycle, the refreshing operation is not executed in a subsequent cycle but is executed in the cycle after the subsequent cycle.

In the first cycle, even if a failure of a given access address is detected, a failure is by no means detected in the same access address in the second cycle. This is because, if a given memory cell deteriorates to reduce its holding time, a failure is more likely to occur upon the access to the memory cell, but the memory cell secures the holding time of, for example, about 100 ms although deteriorated, and one cycle is, for example, about 30 to 100 ns. That is, there is an order-of-magnitude difference therebetween. When a failure is detected in the memory cell in the first cycle, the read data is corrected owing to the ECC function, and the corrected data is newly written. The corrected data is held in the memory cell for at least about 100 ms. Therefore, in the second cycle, the same memory cell is accessed, no failure is detected. A failure is by no means detected in the second cycle, so the refreshing operation can be executed in the third cycle. Accordingly, the refreshing operation can be unfailingly executed sooner or later.

The cycle length is determined based on the write period. The shorter the write period, the shorter the cycle length. In the illustrated example of FIG. 13, the write period T2 corresponds to the operations of the first embodiment. That is, in the first embodiment, the cycle length should be set based on the write period T2. On the other hand, in this embodiment, the cycle length can be set based on the write period T2. Even if a failure is detected, no problem arises as mentioned above. According to this embodiment, the cycle can be set shorter than that of the first embodiment. Therefore, the high-speed memory is realized.

Aside from the system of FIG. 13, a system (ready/busy system) for executing the refreshing operation using a "wait command WAIT" is known in the art. To be specific, when the refreshing operation is necessary, a memory issues the wait command WAIT to a CPU. In response to the wait command WAIT, the CPU stops data input/output for a period corresponding to a few clock pulses. The refreshing operation of the memory is executed during such a period. This system is applicable to the semiconductor storage device 1 according to this embodiment.

Figure 14A:
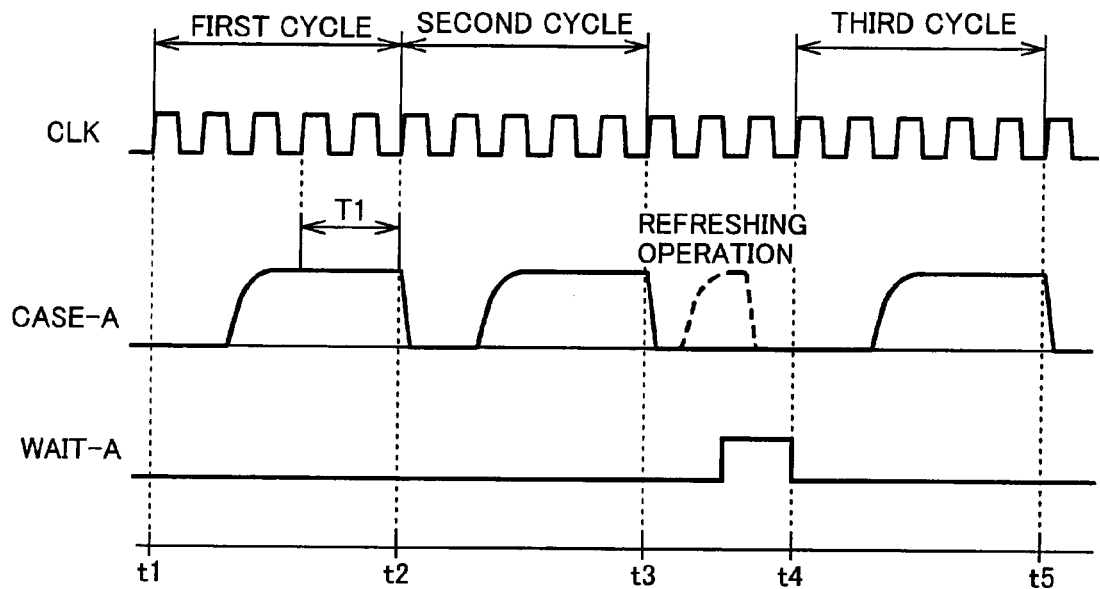
FIG. 14A is a timing chart showing an operational example of the semiconductor storage device according to the second embodiment of the present invention.
Figure 14B:
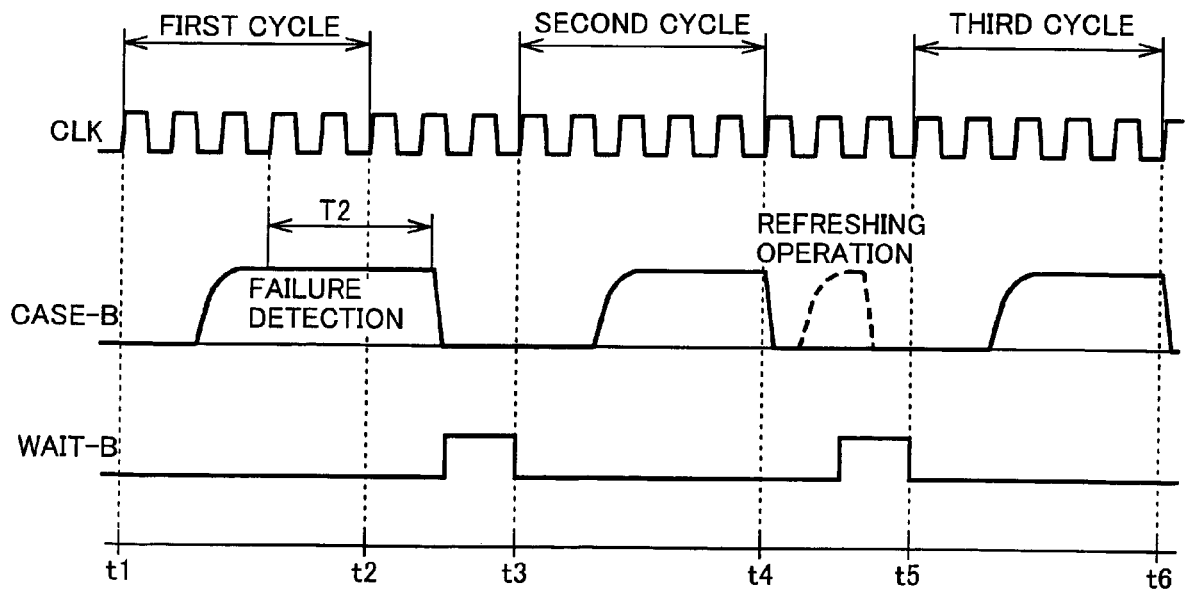
FIG. 14B is a timing chart showing another operational example of the semiconductor storage device according to the second embodiment of the present invention.

FIGS. 14A and 14B are timing charts showing another operational example of the semiconductor storage device 1 according to the second embodiment of the present invention. FIGS. 14A and 14B illustrate a clock signal CLK, word line signals (CASE-A and CASE-B), and wait commands WAIT (WAIT-A and WAIT-B). FIG. 14A corresponds to the case where the error detection/correction circuit 60 does not detect an error, and FIG. 14B corresponds to the case where the error detection/correction circuit 60 detects an error. Further, in one cycle, the read/write operation period is only set, and the refreshing operation period is not allocated.

As shown in FIG. 14A, if no error is detected, a normal operation is repeated. That is, in a first cycle (time t1 to t2), a predetermined partial burst write operation is executed. Similar to the case of FIG. 13, the write period is T1 at this time. In the second cycle (time t2 to t3), another write operation is executed. After the second cycle, the wait command WAIT is sent in response to a request from the internal refresh timer. The refreshing operation is executed thereby. After the refreshing operation, still another write operation is executed in the third cycle (time t4 to t5).

On the other hand, if an error is detected, the operation of FIG. 14B is executed. For example, in the first cycle (time t1 to t2), a predetermined partial burst write operation is executed and a failure is detected. The write period is T2 in this case. One cycle is set based on the write period T1, so the predetermined partial burst write operation ends after the time t2. Thus, if a failure is detected, the memory is instructed to issue a wait command WAIT after the first cycle. The second cycle is therefore started after a predetermined period from the end time t2 of the first cycle. It appears to the CPU that the memory executes the refreshing operation. However, in practice, the extended partial burst write operation is executed.

In the second cycle (time t3 to t4), a normal write operation is executed. Then, the wait command WAIT is issued again after the second cycle. Thus, the refreshing operation is executed. After the refreshing operation, another write operation is executed in the third cycle (time t5 to t6).

In this way, according to this embodiment, when a failure is detected in the first cycle, a first wait command WAIT is issued after the first cycle. A second wait command WAIT is issued after the second cycle subsequent to the first cycle,. In accordance with the first wait command WAIT, the write period is extended. In accordance with the second wait command, the refreshing operation is extended. It appears to the CPU that the memory executes the refreshing operation in either case. In this way, a known wait command is used, so the semiconductor storage device is given the ECC function of the present invention in a hidden form.

As described above, according to the semiconductor storage device 1 according to the present invention, even if the write data is less than the requisite bit number, the ECC bits the total number of which is reduced can be calculated. Further, according to the semiconductor storage device of the present invention, a time period necessary for determining the ECC bits can be reduced. Accordingly, the operational speed increases.

It is apparent that the present invention is not limited to the above embodiment that may be modified and changed without departing from the scope and spirit of the invention.

What is claimed is:

1. A semiconductor storage device, comprising:
a memory cell array;
an ECC cell storing ECC bits;
an ECC computing circuit calculating the ECC bits, which calculates first ECC bits as the ECC bits for first data including at least one write data and a part of read data that is to be read from the memory cell array; and
an error detection/correction circuit,
wherein the read data is input to the error detection/correction circuit and the ECC computing circuit, and the error detection/correction circuit detects an error of the input read data based on the ECC bits read from the ECC cell, and
wherein if the error detection/correction circuit does not detect the error, the ECC computing circuit stores first ECC bits to the ECC cell.

2. The semiconductor storage device according to claim 1, wherein the ECC computating circuit executes a calculation processing for the first ECC bits in parallel with a detection processing of the error by use of the error detection/correction circuit.

3. The semiconductor storage device according to claim 1, wherein the at least one write data is data to be written to a predetermined access address in the memory cell array in a burst mode, and the read data is stored to an address associated with the predetermined access address.

4. The semiconductor storage device according to claim 1, in combination with a pseudo SRAM.

5. A semiconductor storage device, comprising:
a memory cell array;
an ECC cell storing ECC bits;
an ECC computing circuit calculating the ECC bits, which calculates first ECC bits as the ECC bits for first data including at least one write data and a part of read data that is to be read from the memory cell array; and
an error detection/correction circuit,
wherein the read data is input to the error detection/correction circuit and the ECC computing circuit, and the error detection/correction circuit detects an error of the input read data based on the ECC bits read from the ECC cell, and
wherein if the error detection/correction circuit detects the error, and the detected error is an error in an area to which the write data is written, the ECC computating circuit outputs the first ECC bits to the ECC cell.

6. A semiconductor storage device, comprising:
a memory cell array;
an ECC cell storing ECC bits;
an ECC computing circuit calculating the ECC bits, which calculates first ECC bits as the ECC bits for first data including at least one write data and a part of read data that is to be read from the memory cell array; and
an error detection/correction circuit,
wherein the read data is input to the error detection/correction circuit and the ECC computing circuit, and the error detection/correction circuit detects an error of the input read data based on the ECC bits read from the ECC cell, and
wherein if the error detection/correction circuit detects the error, the error detection/correction circuit corrects the read data using the ECC bits to generate corrected data, and the ECC computing circuit calculates second ECC bits as the ECC bits for second data including the write data and a part of the corrected data.

7. The semiconductor storage device according to claim 6, wherein the memory cell array includes a memory cell that needs to be refreshed, and if the error detection/correction circuit detects the error in a first cycle, a refreshing operation is not executed in a second cycle subsequent to the first cycle.

8. The semiconductor storage device according to claim 7, wherein the refreshing operation is executed in a third cycle subsequent to the second cycle.

9. The semiconductor storage device according to claim 6, wherein the memory cell array includes a memory cell that needs to be refreshed, a refreshing operation is executed by issuing a wait command to a CPU, and if the error detection/correction circuit detects the error in a first cycle, the wait command is issued just after the first cycle.

10. The semiconductor storage device according to claim 9, wherein the wait command is issued again just after a second cycle subsequent to the first cycle.

11. A semiconductor storage device, comprising:
a memory cell array;
an ECC cell storing ECC bits;
an error detection/correction circuit detecting and correcting an error of the memory cell array using read data from the memory cell array to output corrected data; and
an ECC generating circuit generating first ECC bits using write data to the memory cell array and the read data from the memory cell array, generating second ECC bits using the corrected data outputted from the error detection/correction circuit, and storing one of the first ECC bits and the second ECC bits to the ECC cell based on a result of error detection for the memory cell array by the error detection/correction circuit.

12. The semiconductor storage device according to claim 11, wherein if the error detection/correction circuit does not detect the error, the ECC generating circuit stores the first ECC bits to the ECC cell.

13. The semiconductor storage device according to claim 12, wherein the ECC generating circuit executes a calculation processing for the first ECC bits in parallel with a detection processing of the error by use of the error detection/correction circuit.

14. The semiconductor storage device according to claim 11, wherein if the error detection/correction circuit detects the error, and the detected error is an error in an area to which the write data is written, the ECC generating circuit outputs the first ECC bits to the ECC cell.

15. The semiconductor storage device according to claim 11, wherein the at least one write data is data to be written to a predetermined access address in the memory cell array in a burst mode, and the read data is stored to an address associated with the predetermined access address.

16. The semiconductor storage device according to claim 11 in combination with a pseudo SRAM.

17. The semiconductor storage device according to claim 11, wherein generating the first ECC bits in the ECC computating circuit and detecting the error in the error detection/correction circuit are processed in parallel.

18. The semiconductor storage device according to claim 17, wherein the ECC generating circuit setting the first ECC bits invalid in the case where the error is detected by the detection/correction circuit, the error detection/correction circuit generating the corrected data using the read data and the ECC bits stored in the ECC cell, the ECC generating circuit generating the second ECC bits using the write data and part of the corrected data.

* * * * *